(12) United States Patent
Yasumori et al.

(10) Patent No.: US 8,362,616 B2
(45) Date of Patent: Jan. 29, 2013

(54) SEMICONDUCTOR DEVICE HAVING PLURALITY OF WIRING LAYERS AND DESIGNING METHOD THEREOF

(75) Inventors: Koji Yasumori, Tokyo (JP); Hisayuki Nagamine, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 166 days.

(21) Appl. No.: 12/819,639

(22) Filed: Jun. 21, 2010

(65) Prior Publication Data
US 2010/0327459 A1    Dec. 30, 2010

(30) Foreign Application Priority Data

Jun. 30, 2009   (JP) ................................. 2009-155815

(51) Int. Cl.
*H01L 23/528* (2006.01)
(52) U.S. Cl. . 257/758; 257/776; 257/786; 257/E23.143; 257/E23.151
(58) Field of Classification Search ............ 257/E23.143
See application file for complete search history.

(56) References Cited

U.S. PATENT DOCUMENTS
7,134,111 B2 * 11/2006 Nakamoto ..................... 257/774

FOREIGN PATENT DOCUMENTS
JP          09-074175          3/1997

* cited by examiner

*Primary Examiner* — Stephen W Smoot
(74) *Attorney, Agent, or Firm* — McDermott Will & Emery LLP (57) ABSTRACT

A semiconductor device includes first and second wirings formed in a first wiring layer and extending parallel to an X direction, third and fourth wirings formed in a third wiring layer and extending parallel to a Y direction; fifth and sixth wirings formed in a second wiring layer positioned between the first and second wiring layers, a first contact conductor that connects the first wiring to the third wiring; and a second contact conductor that connects the second wiring to the fourth wiring. The first and second contact conductors are arranged in the X direction. According to the present invention, because the first and second contact conductors that connect wiring layers that are two or more layers apart are arranged in one direction, a prohibited area that is formed in the second wiring layer can be made narrower. Therefore, the flexibility of the layout of the second wiring layer is enhanced and the restriction on the wiring density can be relaxed.

23 Claims, 8 Drawing Sheets

Prior Art

SEMICONDUCTOR DEVICE HAVING PLURALITY OF WIRING LAYERS AND DESIGNING METHOD THEREOF

BACKGROUND OF THE INVENTION

1. Field of the Invention

The present invention relates to a semiconductor device and a designing method thereof, and more particularly relates to a semiconductor device having a plurality of wiring layers and a designing method thereof.

2. Description of Related Art

In order to fulfill user requirements, logic circuits formed on a semiconductor device such as DRAM (Dynamic Random Access Memory) are becoming increasingly complicated. Therefore, a multi-layered structure is employed for wiring on a semiconductor substrate. In addition, wiring density in each of the wiring layers has been increasing (see Japanese Patent Application Laid-open No. H9-74175).

In case of a multi-layered structure, contact conductors that connect wiring layers penetrate inter-layer insulating layers. Some of the contact conductors connect wiring layers that are two or more wiring layers apart in the multi-layered structure. In this case, intermediate wiring layers are required to be laid out to avoid the contact conductors area. For example, assume that wiring layers are laminated in the order of a first wiring layer, a second wiring layer, and a third wiring layer, and a contact conductor connects the wiring of the first wiring layer to the wiring of the third wiring layer. In this case, wiring in the second wiring layer cannot be formed in an area where the contact conductor exists, so that the wiring in the second wiring layer is required to be laid out to avoid this area.

Contact conductors connecting wiring layers that are two or more wiring layers apart are frequently used for power lines. The reason for this is as follows. Because a power line is required to be formed over a wide area and is required to have a low resistance, it is a common practice to employ an upper-layer wiring having a thick wire width. Consequently, it is necessary to connect to a power line of lower layers at a number of places, so that contact conductors used for this purpose restrict the layout of the intermediate wiring layers. This problem is explained in more detail below with reference to FIG. 8.

Figure 8:
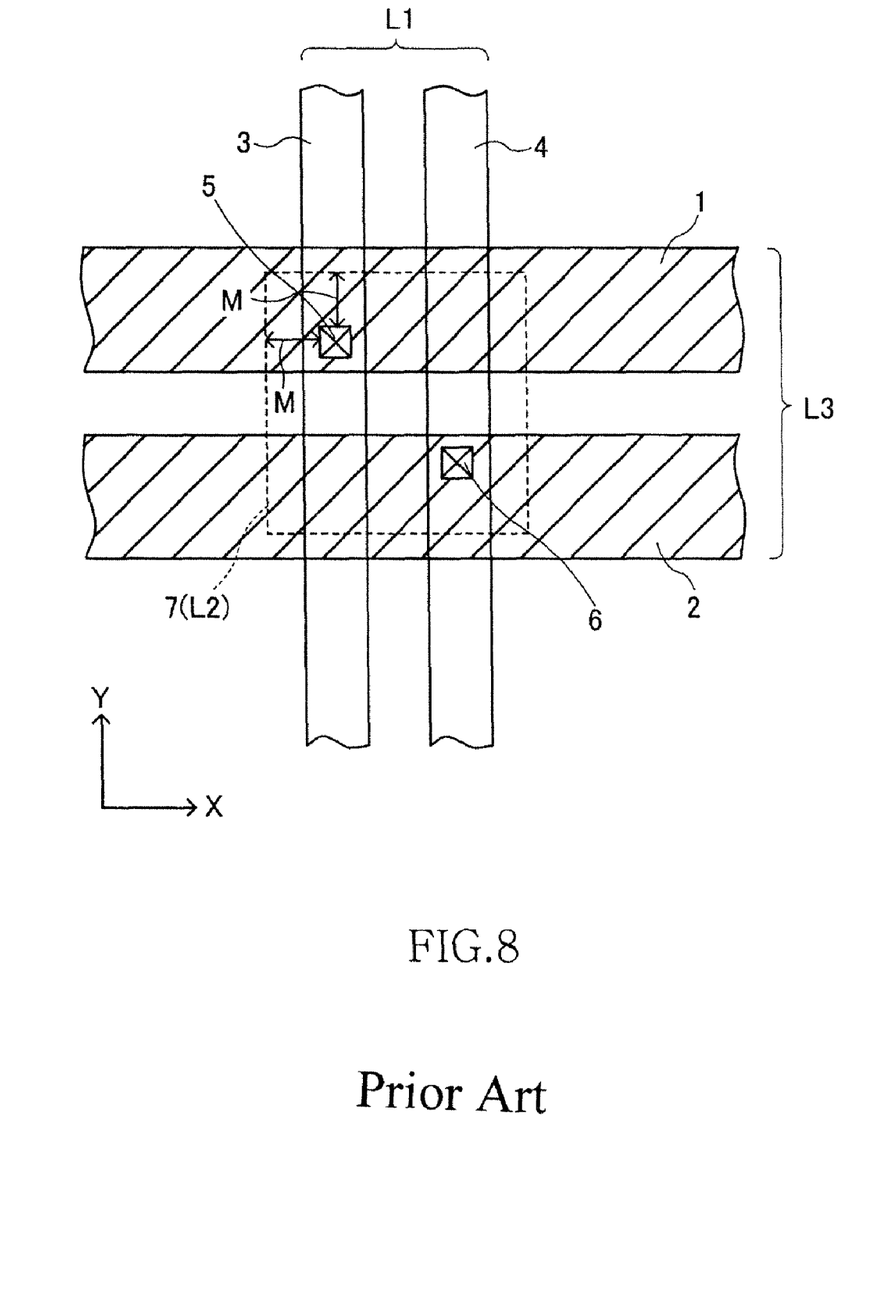
FIG. 8 is a schematic plan view of a wiring layout of a typical semiconductor device.

FIG. 8 is a schematic plan view of a wiring layout of a typical semiconductor device.

The semiconductor device shown in FIG. 8 has three wiring layers, where the uppermost wiring layer L3 has wirings 1 and 2 extending parallel to an X direction, and the lowermost wiring layer L1 has wirings 3 and 4 extending parallel to a Y direction. The wirings 1 and 3 are supplied with the same signal or the same electric potential and they are connected to each other with a contact conductor 5. Similarly, the wirings 2 and 4 are supplied with the same signal or the same electric potential and they are connected to each other with a contact conductor 6.

The wiring in a wiring layer L2 between the wiring layers L1 and L3 is not shown in FIG. 8. Although each of the wirings generally extends in the X direction or the Y direction, the contact conductors 5 and 6 have a diagonal positional relationship. Accordingly, if a predetermined margin M is secured around the contact conductors, no wiring can be formed in at least a prohibited area 7 of the wiring layer L2 shown in FIG. 8. Therefore, a wiring in the wiring layer L2 must be laid out such that it is away from the prohibited area 7.

In this manner, as the layout of the intermediate wiring layer is restricted because of contact conductors that connect wiring layers that are two or more layers apart, it is preferable that the prohibited areas are as small as possible.

SUMMARY

In one embodiment, there is provided a semiconductor device that includes a first wiring and a second wiring formed in a first wiring layer and extending parallel to a first direction, a third wiring and a fourth wiring formed in a second wiring layer and extending parallel to a second direction that intersects with the first direction, a fifth wiring formed in a third wiring layer positioned between the first wiring layer and the second wiring layer, a first contact conductor that connects the first wiring to the third wiring, and a second contact conductor that connects the second wiring to the fourth wiring. The first and second contact conductors are arranged in the first direction.

In another embodiment, there is provided a designing method of a semiconductor device comprising: creating layout data from wiring data; detecting a mesh-shaped wiring pattern by verifying the layout data, the mesh-shaped wiring pattern including a plurality of wirings extending to a first direction formed in a first wiring layer and a plurality of wirings extending to a second direction intersecting with the first direction formed in a second wiring layer, the first and second wiring layers being two or more layers apart; detecting an area that needs correction by further verifying the layout data, the area including a first wiring and a second wiring in the first wiring layer and extending parallel to the first direction, a third wiring and a fourth wiring in the second wiring layer and extending parallel to the second direction, a first contact conductor that connects the first to third wirings, and a second contact conductor that connects the second to fourth wirings; correcting the layout data so that protrusions that protrude in the second direction are formed in the first and second wirings; and laying out the first and second contact conductors in the protrusions.

Thus, according to the present invention, because contact conductors connecting wiring layers that are two or more layers apart are arranged in one direction, prohibited areas that are formed in an intermediate wiring layer can be made smaller. Therefore, the flexibility of the layout of the intermediate wiring layer is enhanced and restriction on the wiring density can be relaxed.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
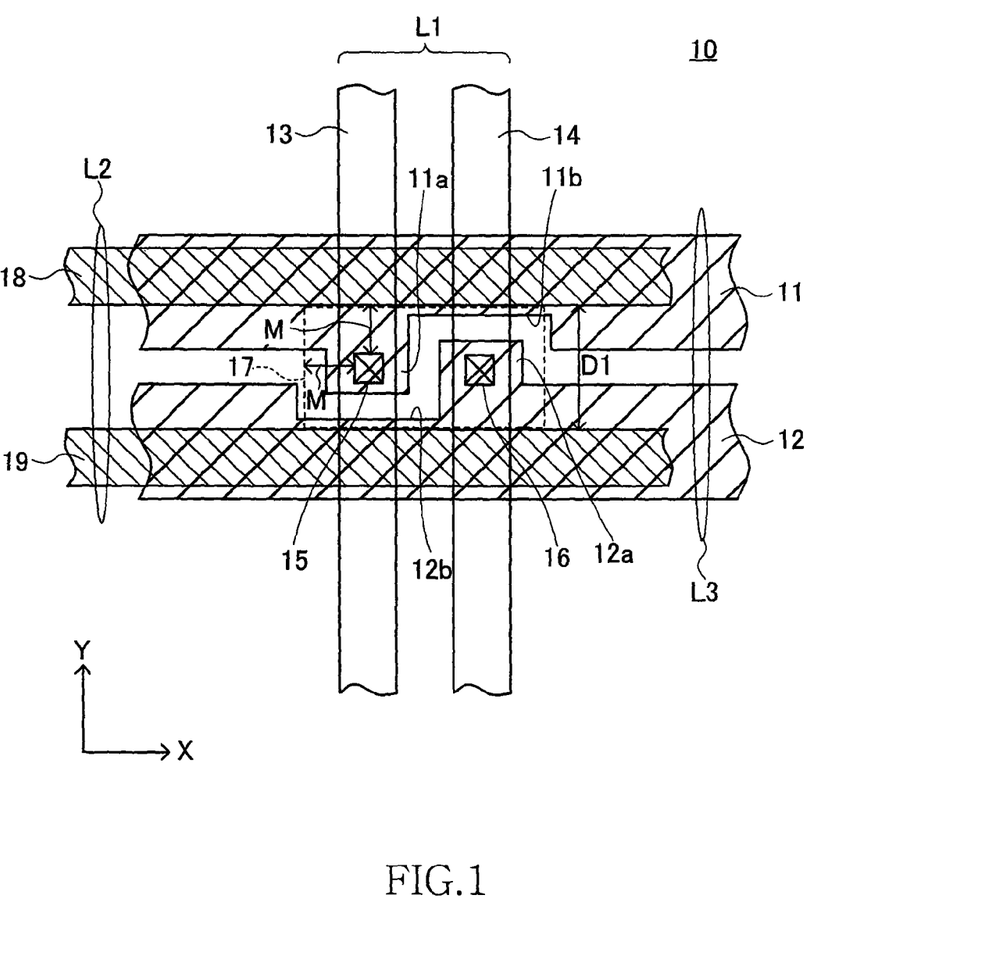
FIG. 1 is a schematic plan view of a wiring layout of a semiconductor device according to a first embodiment of the present invention.

FIG. 1 is a schematic plan view of a wiring layout of a semiconductor device 10 according to a first embodiment of the present invention.

The semiconductor device 10 shown in FIG. 1 has at least three wiring layers, the relatively upper wiring layer L3 has wirings 11 and 12 extending parallel to an X direction, and the relatively lower wiring layer L1 has wirings 13 and 14 extending parallel to a Y direction. The wirings 11 and 13 are supplied with the same signal or the same electric potential and they are connected to each other with a contact conductor 15. Similarly, the wirings 12 and 14 are supplied with the same signal or the same electric potential and they are connected to each other with a contact conductor 16. The wirings 11 and 13 are power lines supplied with a predetermined electric potential (for example, VDD) and the wirings 12 and are power lines supplied with an electric potential different from the above electric potential (for example, VSS). However, the configuration is not limited to thereto.

In the first embodiment, protrusions 11a and 12a are formed in the wirings 11 and 12, respectively. Each of the protrusions 11a and 12a is apart of the wiring and protrudes in the Y direction. The protrusion 11a protrudes in a downward direction in FIG. 1 from the main body of the wiring 11 and the protrusion 12a protrudes in an upward direction in FIG. 1 from the main body of the wiring 12. With this configuration, a part of the protrusion 11a and a part of the protrusion 12a have the same Y coordinate, that is, these parts are aligned in the X direction. The contact conductor 15 is formed in the protrusion 11a and the contact conductor 16 is formed in the protrusion 12a. Therefore, the contact conductors 15 and 16 have the same Y coordinate, that is, the contact conductors 15 and 16 are aligned in the X direction.

Notched portions 11b and 12b are cuts in the main bodies of the wirings 11 and 12 from the Y direction. The notched portion 11b is a cut of the main body of the wiring 11 from the upward direction in FIG. 1, and the notched portion 12b is a cut of the main body of the wiring 12 from the downward direction in FIG. 1. At least a part of the protrusion 11a of the wiring 11 is arranged so as to be surrounded by the notched portion 12b of the wiring 12. Similarly, at least a part of the protrusion 12a of the wiring 12 is arranged so as to be surrounded by the notched portion 11b of the wiring 11. By having the notched portions 11b and 12b, although the protrusions 11a and 12a are provided in the wirings 11 and 12, the wiring interval does not have to be widened.

Thus, in the semiconductor device 10 according to the first embodiment, differently from the conventional semiconductor device shown in FIG. 8, because the contact conductors 15 and 16 are aligned in the X direction, a width D1 in the Y direction of a prohibited area 17 in which wirings in the intermediate wiring layer L2 cannot be formed can be made narrower. The prohibited area 17 is an area laying within a predetermined margin M around the contact conductors 15 and 16 and it is necessary to lay out the wiring in the wiring layer L2 away from the prohibited area 17. In the first embodiment, the width D1 in the Y direction of the prohibited area 17 is made narrower. Therefore, as shown in FIG. 1, even when wirings 18 and 19 extending in the Y direction are formed in the wiring layer L2, the wiring interval between the wirings 18 and 19 can be made narrower as compared to those in the conventional technique. Although not limited thereto, the wirings 18 and 19 are predetermined signal lines.

As explained above, in the semiconductor device 10 according to the first embodiment, because the prohibited area 17 in the intermediate wiring layer L2 is made smaller, the flexibility of the layout of the wiring layer L2 is enhanced. Furthermore, due to the downsizing of the prohibited area 17, restriction on the wiring density can be relaxed, and changes can be made easily if there arises a need to make any designing changes. Further, in the first embodiment, because the wirings 13 and 14 formed in the lower wiring layer L1, which has a relatively lower designing flexibility, are formed in a straight shape, and the wirings 11 and 12 formed in the upper wiring layer L3, which has a relatively higher designing flexibility, are formed with the protrusions and notched portions, layout designing can be performed easily.

Figure 2:
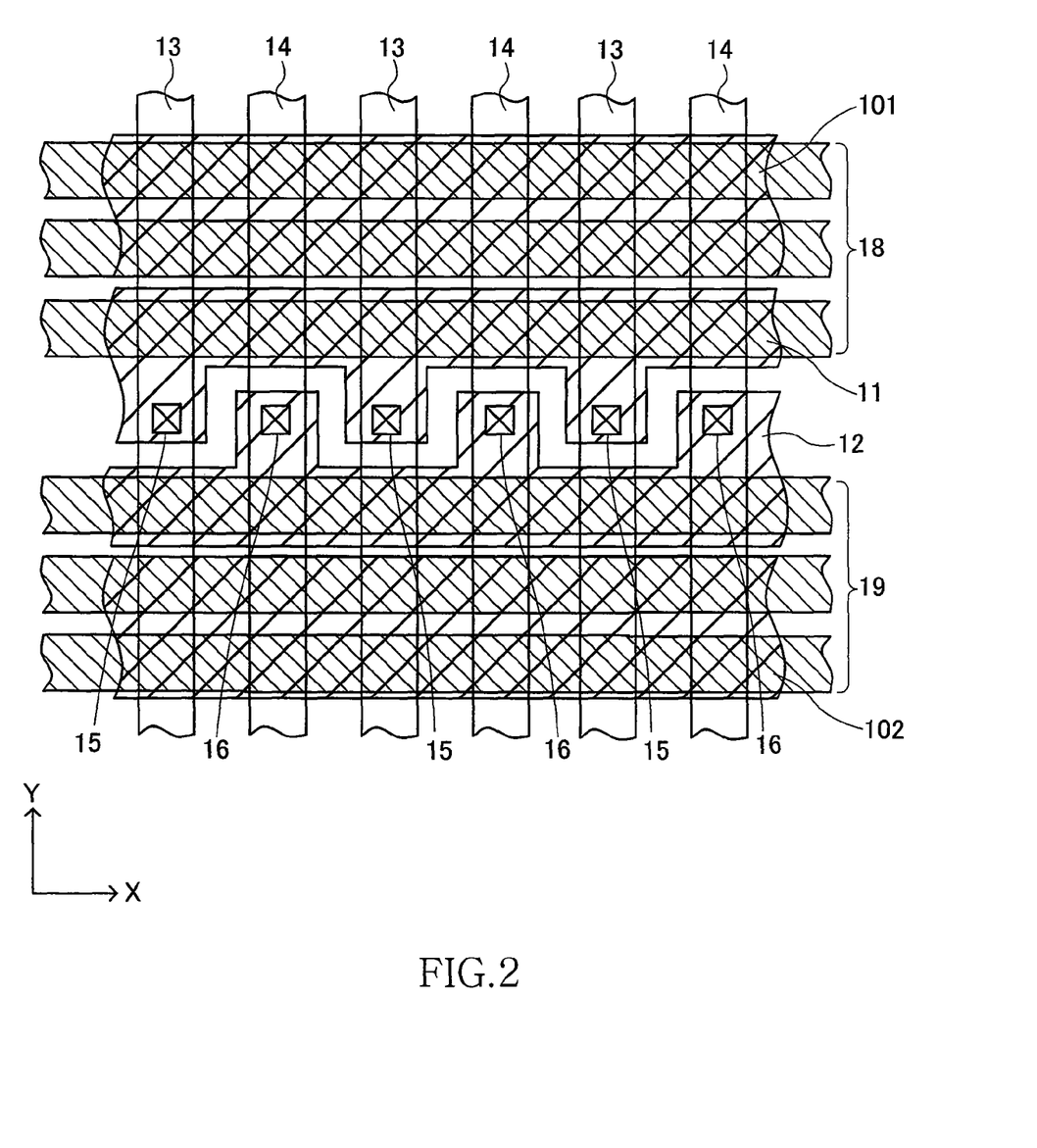
FIG. 2 is a layout diagram of a mesh wiring configured by repeating the layout of the power line shown in FIG. 1.

FIG. 2 is a layout diagram of a mesh wiring configured by repeating the layout of the power line shown in FIG. 1. Wirings 101 and 102 are added in the wiring layer L3, as shown in FIG. 2. The mesh-shaped power line is connected at a plurality of places in the upper and lower wiring layers. In this case, by arranging three or more contact conductors 15 and 16 in the X direction, the prohibited area 17 formed in the intermediate wiring layer L2 extends in the X direction, so that the width D1 in the Y direction of the prohibited area 17 is maintained within a constant range. Therefore, more wirings can be arranged by forming the wirings 18 and 19 in the wiring layer L2 as to extend in the X direction.

Figure 3:
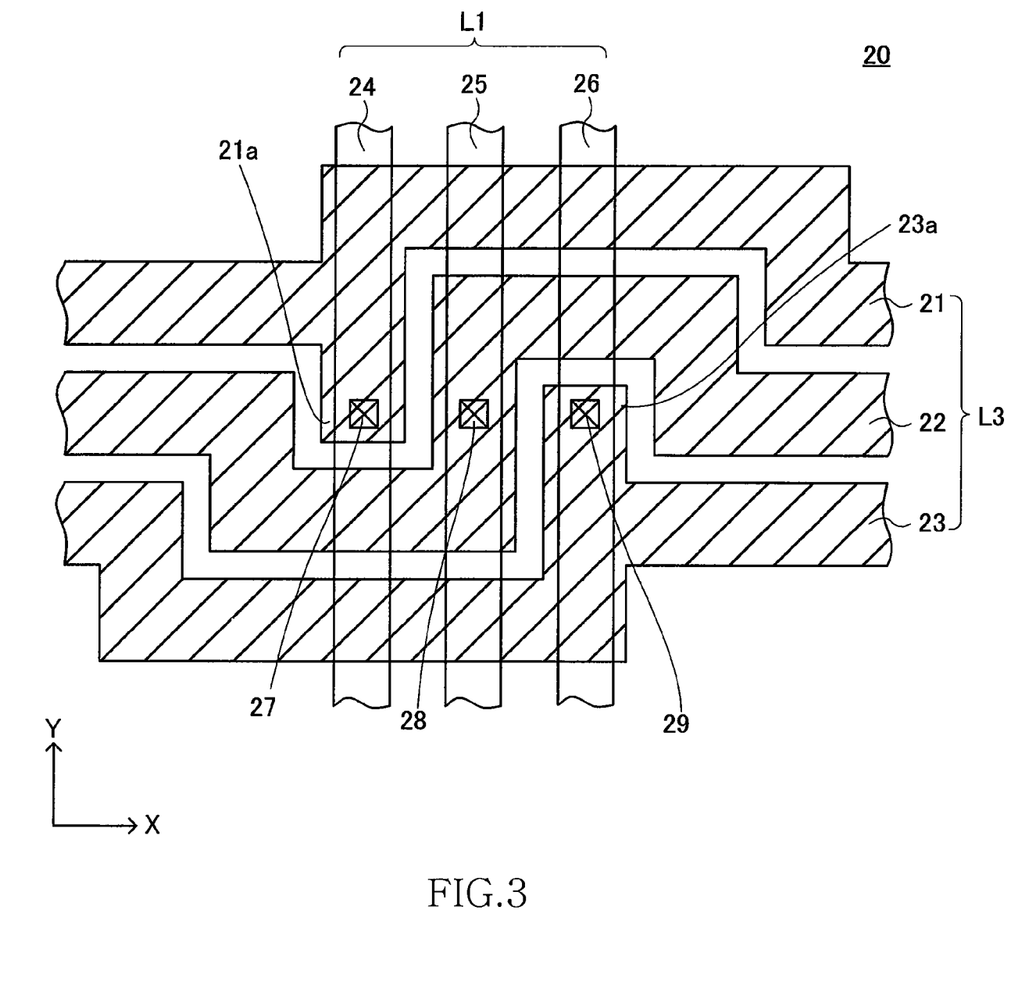
FIG. 3 is a schematic plan view of a wiring layout of a semiconductor device according to a second embodiment of the present invention.

FIG. 3 is a schematic plan view of a wiring layout of a semiconductor device 20 according to a second embodiment of the present invention.

The semiconductor device 20 shown in FIG. 3 is different from the semiconductor device 10 shown in FIG. 1 in that three wirings 21 to 23 in the wiring layer L3 connect three wirings 24 to 26 formed in the wiring layer L1, respectively.

More specifically, the semiconductor device 20 according to the second embodiment has at least three wiring layers, the upper wiring layer L3 has the wirings 21 to 23 extending parallel to the X direction, and the lower wiring layer L1 has the wirings 24 to 26 extending parallel to the Y direction. The wirings 21 and 24 are supplied with the same signal or the same electric potential and they are connected to each other with a contact conductor 27. Similarly, the wirings 22 25 are supplied with the same signal or the same electric potential and they are connected to each other with a contact conductor 28. Furthermore, the wirings 23 and 26 are supplied with the same signal or the same electric potential and they are connected to each other with a contact conductor 29.

In the second embodiment, no protrusion is formed in the central wiring 22 in the wiring layer L3, however, the wiring 22 is made to extend in the X direction in a meandering shape. The protrusions 21a and 23a of the wirings 21 and 23 are positioned in empty areas formed because of the meandering shape of the wiring 22. Therefore, three contact conductors 27 to 29 can be arranged in the X direction. As a result, when forming a wiring (not shown) in the central wiring layer L2 in the X direction, more wiring areas can be secured as compared to those in the conventional technique.

In this manner, the present invention is also applicable to a case where three or more wirings supplied with different signals or different electric potentials are connected in the upper and lower wiring layers.

Figure 4:
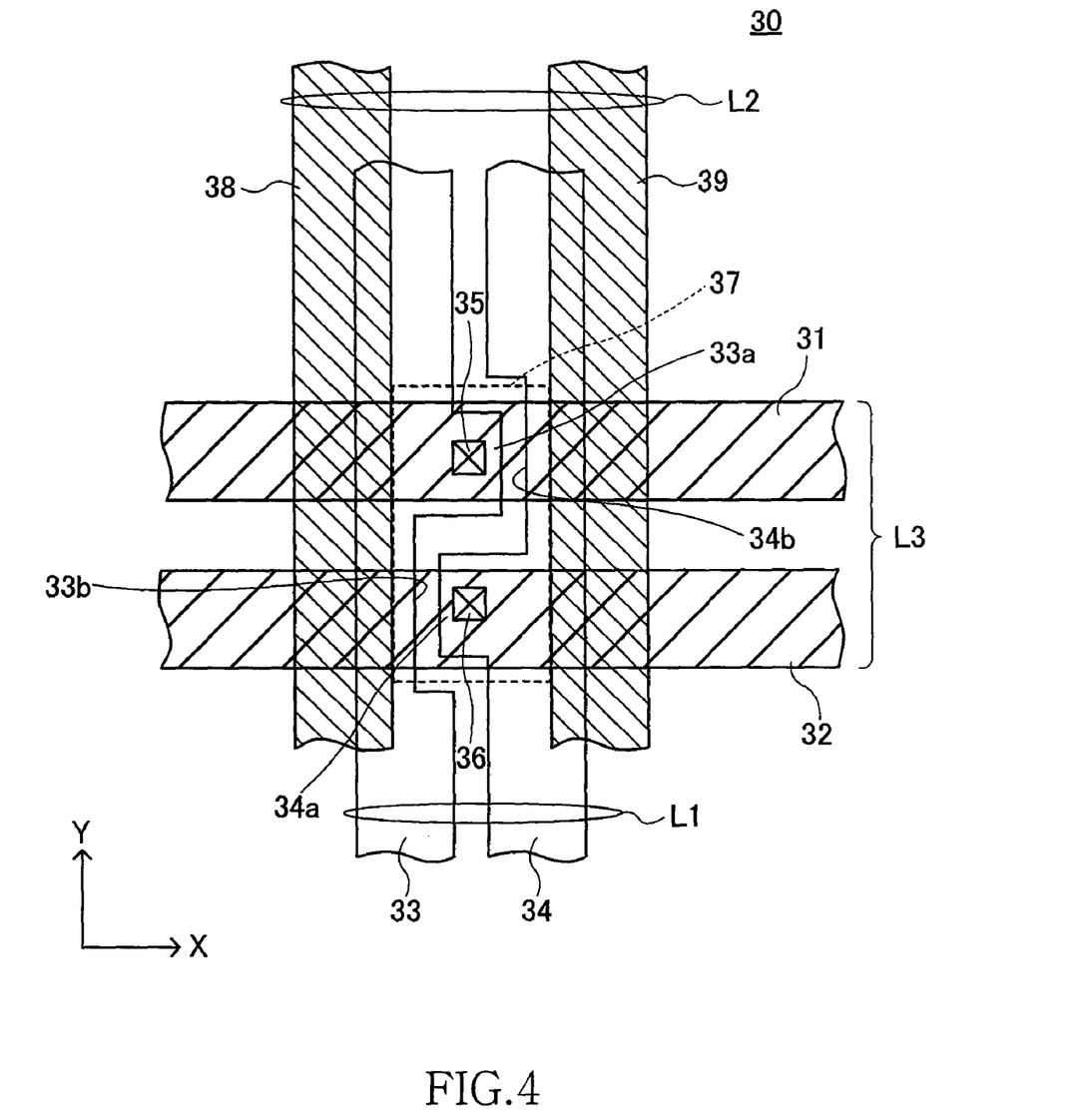
FIG. 4 is a schematic plan view of a wiring layout of a semiconductor device according to a third embodiment of the present invention.

FIG. 4 is a schematic plan view of a wiring layout of a semiconductor device 30 according to a third embodiment of the present invention.

The semiconductor device 30 shown in FIG. 4 is different from the semiconductor device 10 shown in FIG. 1 in that a protrusion and a notched portion are formed in wirings 33 and 34 in the wiring layer L1, and wirings 31 and 32 in the wiring layer L3 have a straight shape.

More specifically, the semiconductor device 30 according to the third embodiment has at least three wiring layers, the upper wiring layer L3 has the wirings 31 and 32 extending parallel to the X direction and the lower wiring layer L1 has the wirings 33 and 34 extending parallel to the Y direction. The wirings 31 and 33 are supplied with the same signal or the same electric potential and they are connected to each other with a contact conductor 35. Similarly, the wirings 32 and 34 are supplied with the same signal or the same electric potential and they are connected to each other with a contact conductor 36.

In the third embodiment, a protrusions 33a and 34a are formed in the wiring 33 and 34, respectively. Each of the protrusions 33a and 34a is a part of the wiring and protrudes in the X direction. The protrusion 33a protrudes toward a right direction in FIG. 4 from the main body of the wiring 33 and the protrusion 34a protrudes toward a left direction in FIG. 4 from the main body of the wiring 34. With this configuration, apart of the protrusion 33a and a part of the protrusion 34a have the same X coordinate, that is, these portions are aligned in the Y direction. The contact conductors 35 and 36 are formed in the protrusion 33a and 34a, respectively. Therefore, the contact conductors 35 and 36 have the same X coordinate, that is, the contact conductors 35 and 36 are aligned in the Y direction.

Moreover, a notched portion 33b that is a cut of the main body of the wiring 33 in the X direction is provided in the wiring 33 and a notched portion 34b that is a cut of the main body of the wiring 34 in the X direction is provided in the wiring 34. The notched portion 33b is formed by cutting out a part of the main body of the wiring 33 from the right direction in FIG. 4 and the notched portion 34b is formed by cutting out a part of the main body of the wiring 34 from the left direction in FIG. 4. At least a part of the protrusion 33a of the wiring 33 is arranged so as to be surrounded by the notched portion 34b of the wiring 34. Similarly, at least a part of the protrusion 34a of the wiring 34 is arranged so as to be surrounded by the notched portion 33b of the wiring 33.

In this manner, the wiring to which a protrusion or a notched portion is provided can be formed in an upper layer as in the first embodiment, or it can be formed in a lower layer as in the third embodiment.

A designing method of a semiconductor device according to embodiments of the present invention is explained below.

Figure 5:
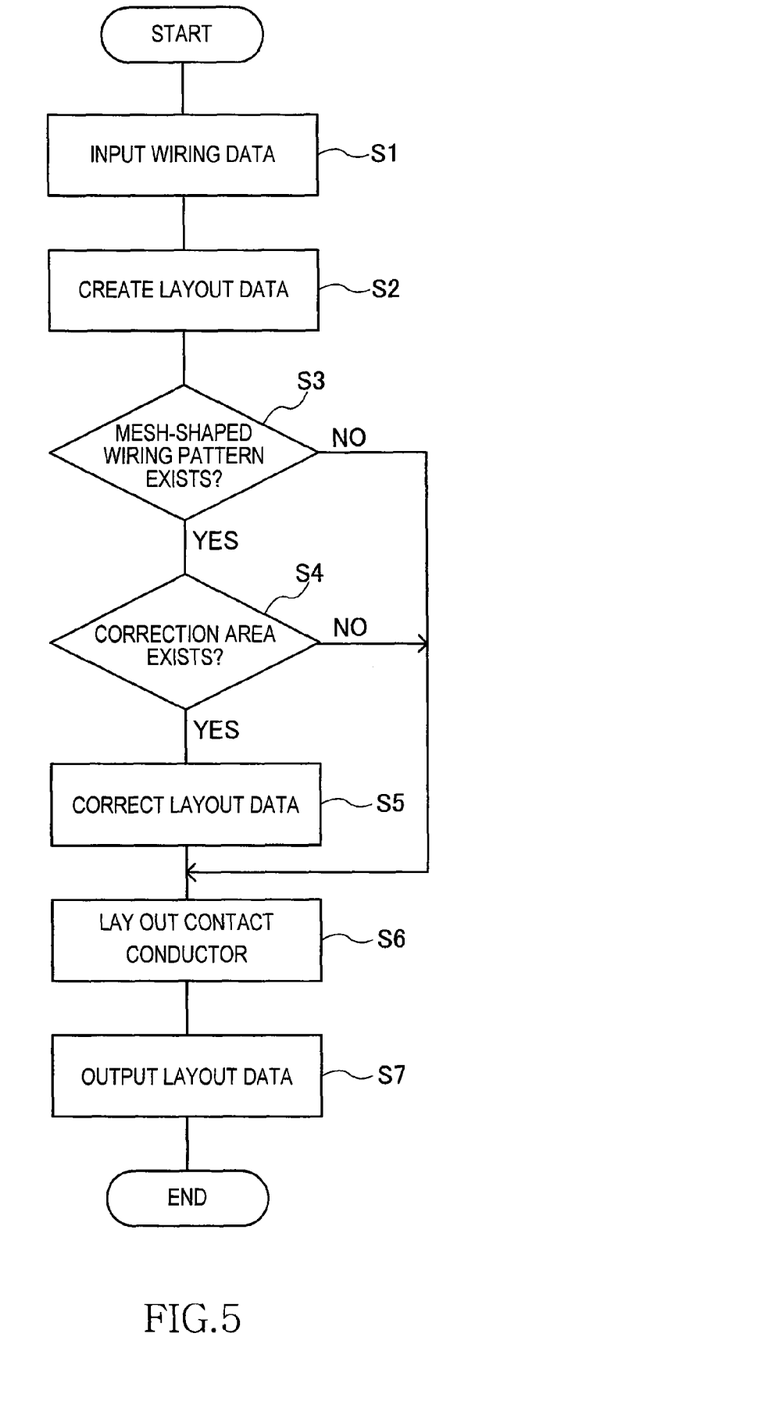
FIG. 5 is a flowchart for explaining the designing method of the semiconductor device according to the present embodiments.
Figure 6:
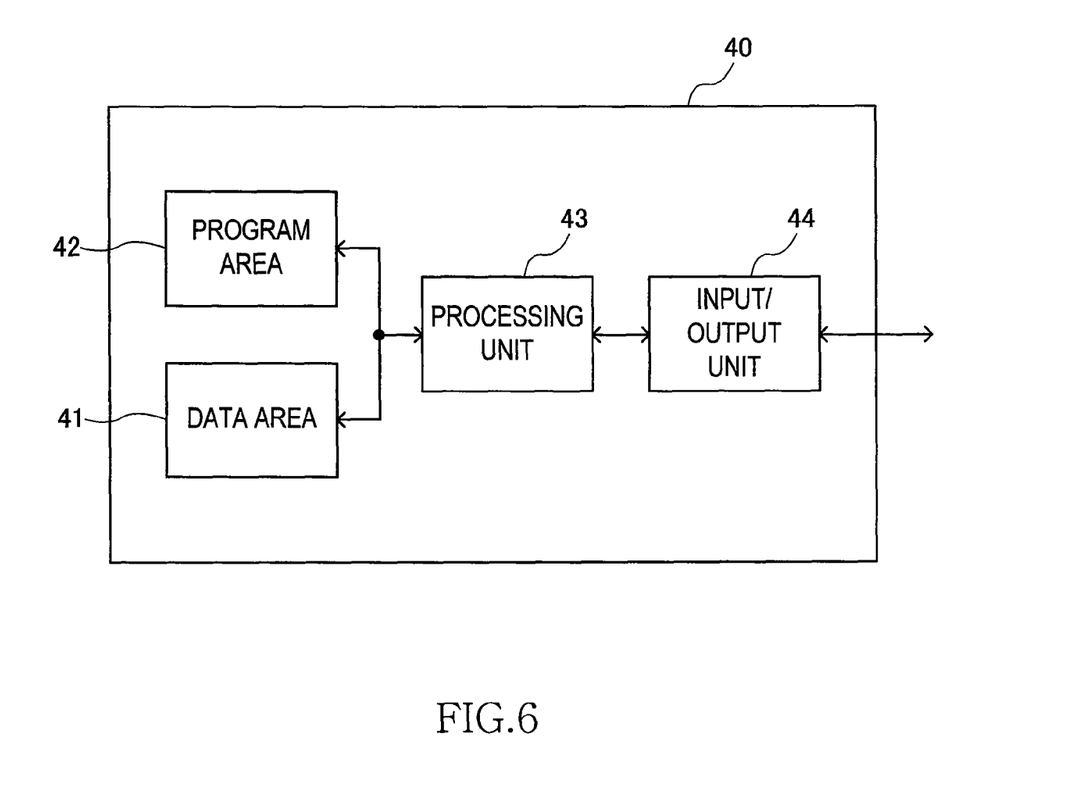
FIG. 6 is a block diagram of a configuration of a designing device that carries out the designing method.

FIG. 5 is a flowchart for explaining the designing method of the semiconductor device according to the present embodiment. FIG. 6 is a block diagram of a configuration of a designing device 40 that carries out the designing method.

The designing device 40 shown in FIG. 6 includes a data area 41 for storing therein wiring data and layout data, a program area 42 for storing therein a designing program, a processing unit 43 for executing the designing program, and an input/output unit 44 for inputting wiring data and outputting layout data. When designing a semiconductor device by using the designing device 40, as shown in FIG. 5, first, wiring data of a designing target semiconductor device is input by using the input/output unit 44 and the wiring data is stored in the data area 41 (Step S1).

Subsequently, the processing unit 43 creates layout data from the wiring data by using the designing program stored in the program area 42 (Step S2). The layout data created in this manner is stored in the data area 41. Further, the processing unit 43 verifies the layout data by using the designing program stored in the program area 42 and determines whether there exists a mesh-shaped wiring pattern (Step S3). Detection of the mesh-shaped wiring pattern at Step S3 is limited to detecting a wiring pattern that is formed in a wiring layer that is two or more wiring layers apart. When no mesh-shaped wiring pattern exists (Step S3: NO), the processing unit 43 lays out contact conductors by using the designing program (Step S6).

On the other hand, when there exists a mesh-shaped wiring pattern (Step S3: YES), the processing unit 43 further verifies the layout data and determines whether there exists an area that needs correction (Step S4). The area that needs correction is, for example, the prohibited area 7 shown in FIG. 8. That is, when two or more wirings to which different signals or different electric potentials are applied are laid out parallel to the X direction in one wiring layer and two or more wirings to which different signals or different electric potentials are applied are laid out parallel to the Y direction in another wiring layer, the area that needs correction is an area in which it is necessary to connect the wirings of the wiring layers with two or more contact conductors. When no area that needs correction exists (Step S4: NO), the processing unit 43 lays out contact conductors by using the designing program (Step S6).

When an area that needs correction exists (Step S4: YES), the processing unit 43 corrects the layout data of one of the wiring layers (preferably the wiring layer located above) such that the protrusions or notched portions shown in FIG. 1, for example, are formed in the wiring formed in that wiring layer (Step S5). The processing unit 43 then lays out the contact conductors in the protrusions in such a manner that the contact conductors are aligned in the X direction or the Y direction (Step S6). With this process, the layout in the area that needs correction is corrected and, for example, the layout shown in FIG. 8 is changed to the layout shown in FIG. 1. The changed layout data is stored in the data area 41.

The layout data stored in the data area 41 in this manner is output to outside by the input/output unit 44 (Step S7) and the layout data is used for mask designing and the like in actual fabrication processes.

It is apparent that the present invention is not limited to the above embodiments, but may be modified and changed without departing from the scope and spirit of the invention.

For example, in the present invention, the number of wiring layers between the upper and lower wiring layers and connected with a contact conductor is not limited to one, and can be two or more.

Figure 7:
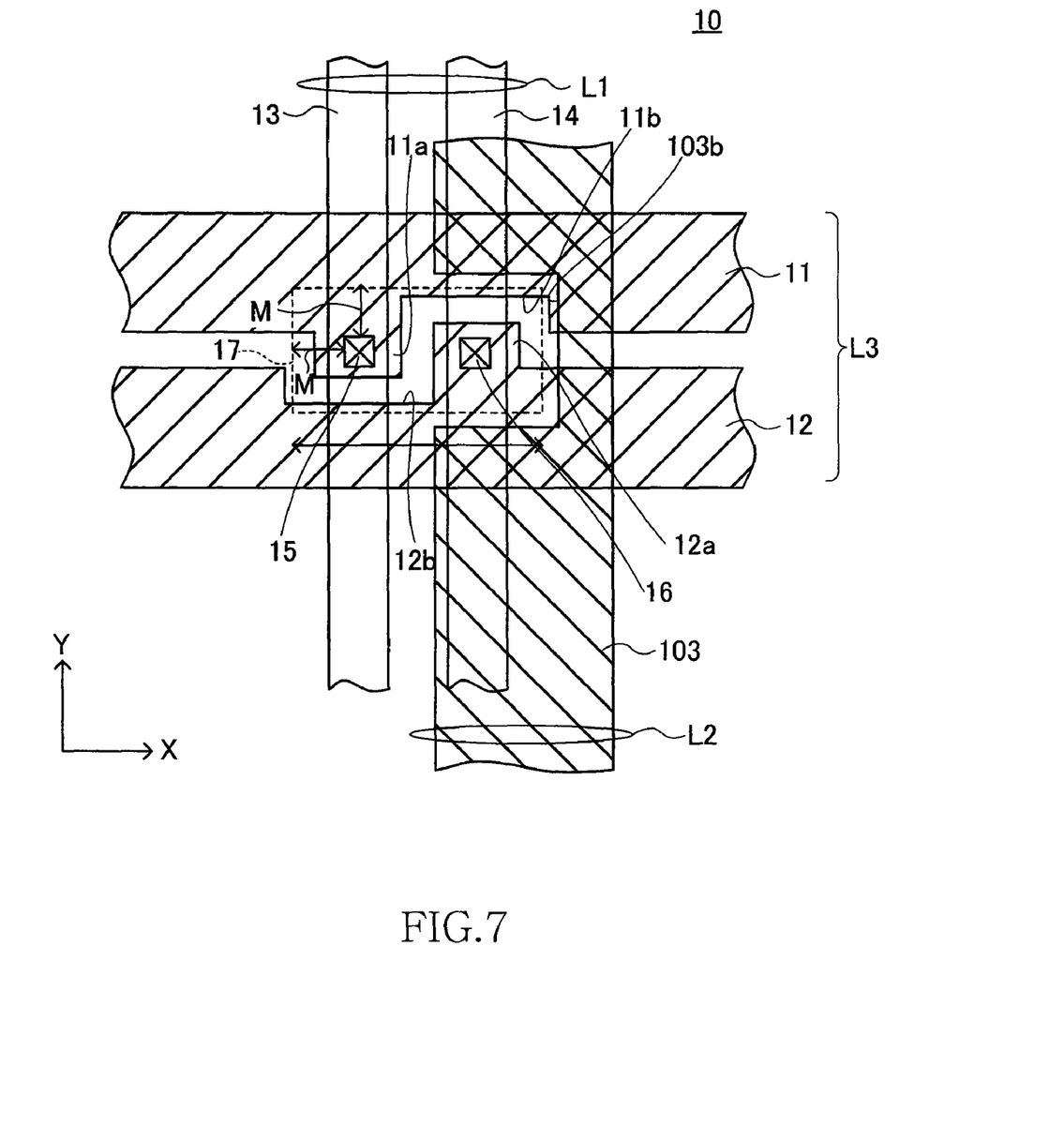
FIG. 7 is a schematic plan view of a wiring layout of a semiconductor device according to a modification.

Furthermore, in the above embodiments, the direction in which the contact conductors are arranged and the direction in which the wirings in the wiring layer L2 extend are the same; however, this configuration is not essential in the present invention. For example, as in a modification of the first embodiment shown in FIG. 7, a configuration is allowable in which the contact conductors 15 and 16 are arranged in the X direction and a wiring 103 formed in the wiring layer L2 is arranged in the Y direction. When such a layout is employed, to be away from the prohibited area 17, it is necessary to form a notched portion 103b in the wiring 103. However, because a width of the notched portion 103b in the Y direction is narrower than that in the conventional technique, it is possible to reduce the increase in the wiring resistance arising due to the formation of the notched portion.

What is claimed is:

1. A semiconductor device comprising:
   a first wiring and a second wiring formed in a first wiring layer and extending to a first direction;
   a third wiring and a fourth wiring formed in a second wiring layer and extending to a second direction that intersects with the first direction;
   a first contact conductor that connects the first wiring to the third wiring; and
   a second contact conductor that connects the second wiring to the fourth wiring, wherein
   the first and second contact conductors are arranged in the first direction, and
   the first wiring and the second wiring are offset from each other in the second direction.

2. The semiconductor device as claimed in claim 1, wherein
   the first and second wirings include protrusions that protrude in the second direction, and
   the first and second contact conductors are connected at the protrusions of the first and second wirings, respectively.

3. The semiconductor device as claimed in claim 2, wherein the protrusions of the first and second wirings protrude in mutually opposite directions.

4. The semiconductor device as claimed in claim 3, wherein
   the first and second wirings include notched portions that are cut out in the second direction,
   at least a part of the protrusion of the first wiring is arranged so as to be surrounded by the notched portion of the second wiring, and
   at least a part of the protrusion of the second wiring is arranged so as to be surrounded by the notched portion of the first wiring.

5. The semiconductor device as claimed in claim 1, further comprising:
   a sixth wiring formed in the first wiring layer and extending in the first direction;
   a seventh wiring formed in the second wiring layer and extending in the second direction; and
   a third contact conductor that connects the sixth wiring to the seventh wiring, wherein
   the first, second, and third contact conductors are arranged in the first direction.

6. The semiconductor device as claimed in claim 1, further comprising a fifth wiring formed in a third wiring layer positioned between the first wiring layer and the second wiring layer.

7. The semiconductor device as claimed in claim 6, wherein the fifth wiring extends in the first direction.

8. The semiconductor device as claimed in claim 6, wherein the first wiring layer is located above the third wiring layer and the second wiring layer is located below the third wiring layer.

9. The semiconductor device as claimed in claim 6, wherein the first and third wirings serve as a first power line to which a first electric potential is applied and the second and fourth wirings serve as a second power line to which a second electric potential different from the first electric potential is applied.

10. The semiconductor device as claimed in claim 9, wherein the fifth wiring serves as a signal line.

11. The semiconductor device as claimed in claim 1, wherein the first wiring and the second wiring overlap each other in the second direction.

12. The semiconductor device as claimed in claim 1, wherein the first and second wirings extend parallel to the first direction, and the third and fourth wirings extend parallel to the second direction.

13. A semiconductor device comprising:
    a first wiring and a second wiring formed in a first wiring layer and extending to a first direction;
    a third wiring and a fourth wiring formed in a second wiring layer and extending to a second direction that intersects with the first direction;
    a first contact conductor that connects the first wiring to the third wiring; and
    a second contact conductor that connects the second wiring to the fourth wiring, wherein
    the first and second contact conductors are arranged in the first direction,
    the first and second wirings include protrusions that protrude in the second direction, and
    the first and second contact conductors are connected at the protrusions of the first and second wirings, respectively.

14. The semiconductor device as claimed in claim 13, wherein the protrusions of the first and second wirings protrude in mutually opposite directions.

15. The semiconductor device as claimed in claim 14, wherein
    the first and second wirings include notched portions that are cut out in the second direction,
    at least a part of the protrusion of the first wiring is arranged so as to be surrounded by the notched portion of the second wiring, and
    at least a part of the protrusion of the second wiring is arranged so as to be surrounded by the notched portion of the first wiring.

16. The semiconductor device as claimed in claim 13, further comprising:
    a sixth wiring formed in the first wiring layer and extending in the first direction;
    a seventh wiring formed in the second wiring layer and extending in the second direction; and
    a third contact conductor that connects the sixth wiring to the seventh wiring, wherein
    the first, second, and third contact conductors are arranged in the first direction.

17. The semiconductor device as claimed in claim 13, wherein the first and second wirings extend parallel to the first direction, and the third and fourth wirings extend parallel to the second direction.

18. A semiconductor device comprising:
    a first wiring and a second wiring formed in a first wiring layer and extending to a first direction;
    a third wiring and a fourth wiring formed in a second wiring layer and extending to a second direction that intersects with the first direction;
    a first contact conductor that connects the first wiring to the third wiring;
    a second contact conductor that connects the second wiring to the fourth wiring; and
    a fifth wiring formed in a third wiring layer positioned between the first wiring layer and the second wiring layer, wherein
    the first and second contact conductors are arranged in the first direction.

19. The semiconductor device as claimed in claim 18, wherein the fifth wiring extends in the first direction.

20. The semiconductor device as claimed in claim 18, wherein the first wiring layer is located above the third wiring layer and the second wiring layer is located below the third wiring layer.

21. The semiconductor device as claimed in claim 18, wherein the first and third wirings serve as a first power line to which a first electric potential is applied and the second and fourth wirings serve as a second power line to which a second electric potential different from the first electric potential is applied.

22. The semiconductor device as claimed in claim 21, wherein the fifth wiring serves as a signal line.

23. The semiconductor device as claimed in claim 18, wherein the first and second wirings extend parallel to the first direction, and the third and fourth wirings extend parallel to the second direction.

* * * * *